US008915557B2

(12) United States Patent
Doglio et al.

(10) Patent No.: US 8,915,557 B2
(45) Date of Patent: Dec. 23, 2014

(54) LOCKING MECHANISM FOR ADAPTOR ASSEMBLY OF A SERVER RACK CHASSIS

(71) Applicants: Jean Doglio, Pflugerville, TX (US); Bernard D. Strmiska, Round Rock, TX (US); Richard D. Trotta, Pflugerville, TX (US); Vibora Sim, Pflugerville, TX (US)

(72) Inventors: Jean Doglio, Pflugerville, TX (US); Bernard D. Strmiska, Round Rock, TX (US); Richard D. Trotta, Pflugerville, TX (US); Vibora Sim, Pflugerville, TX (US)

(73) Assignee: Dell Products, LP, Round Rock, TX (US)

( * ) Notice: Subject to any disclaimer, the term of this patent is extended or adjusted under 35 U.S.C. 154(b) by 70 days.

(21) Appl. No.: 13/624,418

(22) Filed: Sep. 21, 2012

(65) Prior Publication Data

US 2014/0084764 A1    Mar. 27, 2014

(51) Int. Cl.
*A47B 97/00* (2006.01)

(52) U.S. Cl.
USPC ............... 312/223.2; 312/222; 312/332.1

(58) Field of Classification Search
USPC ............ 312/222, 319.1, 332.1, 223.2; 361/679.58, 679.59, 726; 292/194, 292/195, 198, 200, 219, 220, 228, 221, 226, 292/95, 96, 99, 100, 121, 122, 128, 126, 292/DIG. 69
See application file for complete search history.

(56) References Cited

U.S. PATENT DOCUMENTS

| | | | |
|---|---|---|---|
| 2,926,056 A * | 2/1960 | Newcomer, Jr. et al. | 312/332.1 |
| 2,944,864 A * | 7/1960 | Krivulka | 312/332.1 |
| 3,511,549 A * | 5/1970 | Macaluso | 312/219 |
| 3,521,939 A * | 7/1970 | Vaughn et al. | 312/332.1 |
| 4,003,614 A * | 1/1977 | Geer et al. | 312/332.1 |
| 4,006,951 A * | 2/1977 | Geer et al. | 312/332.1 |
| 6,762,934 B2 | 7/2004 | Kitchen et al. | |
| 6,912,132 B2 | 6/2005 | Riddiford et al. | |
| 6,952,341 B2 * | 10/2005 | Hidaka et al. | 361/679.32 |
| 6,953,232 B2 * | 10/2005 | Busby et al. | 312/332.1 |
| 7,576,979 B1 | 8/2009 | Dearborn et al. | |
| 2004/0100762 A1 * | 5/2004 | Yuan et al. | 361/685 |
| 2006/0023430 A1 | 2/2006 | Karstens | |
| 2006/0067063 A1 * | 3/2006 | Stahl et al. | 361/754 |
| 2009/0058236 A1 * | 3/2009 | Lin | 312/223.2 |
| 2009/0080165 A1 | 3/2009 | Barina et al. | |
| 2009/0086456 A1 * | 4/2009 | Milo et al. | 361/801 |
| 2009/0284907 A1 | 11/2009 | Regimbal et al. | |
| 2011/0095153 A1 * | 4/2011 | Zhang et al. | 248/309.1 |

* cited by examiner

*Primary Examiner* — Hanh V Tran
(74) *Attorney, Agent, or Firm* — Larson Newman, LLP

(57) ABSTRACT

A locking mechanism includes a latch, a handle, a first link, and a second link. The latch to engage with a recess of a server rack chassis, and to lock an adaptor assembly within the server rack chassis. The handle is connected to the latch, and engages and disengages the latch with the recess. The first link includes a first stub. The first link puts the first stub in an up position in response to the handle being in a down position, and puts the first stub in a down position in response to the handle being in an up position. The second link includes a second stub. The second link puts the second stub in a down position in response to the handle being in the down position, and puts the second stub in an up position in response to the handle being in the up position.

13 Claims, 6 Drawing Sheets

LOCKING MECHANISM FOR ADAPTOR ASSEMBLY OF A SERVER RACK CHASSIS

FIELD OF THE DISCLOSURE

This disclosure generally relates to information handling systems, and more particularly relates to a locking mechanism for an adaptor assembly for a server rack chassis.

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements can vary between different applications, information handling systems can also vary regarding what information is handled, how the information is handled, how much information is processed, stored, or communicated, and how quickly and efficiently the information can be processed, stored, or communicated. The variations in information handling systems allow for information handling systems to be general or configured for a specific user or specific use such as financial transaction processing, airline reservations, enterprise data storage, or global communications. In addition, information handling systems can include a variety of hardware and software components that can be configured to process, store, and communicate information and can include one or more computer systems, data storage systems, and networking systems.

A server rack chassis can hold multiple devices, such as servers, power supplies, hard drive bays, and the like. Each of the servers, power supplies, and hard drive bays usually includes a mechanism to install or remove the device. The mechanism may also be used to lock the device in placed with the server rack chassis.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION OF DRAWINGS

The following description in combination with the Figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other teachings can certainly be utilized in this application.

Figure 1:
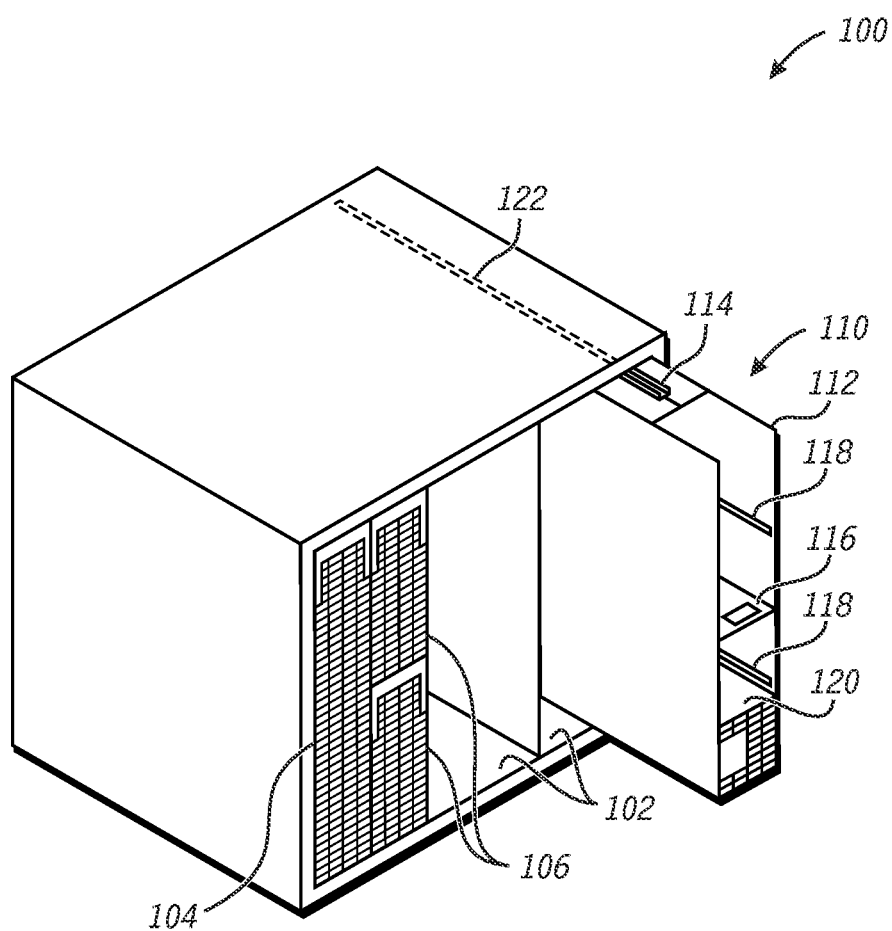
FIG. 1 is a perspective view of a server rack chassis.

FIG. 1 shows a perspective view of a server rack chassis 100 for an information handling system. For purposes of this disclosure, the information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network server or storage device, a switch router or other network communication device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communications between the various hardware components.

The server rack chassis 100 includes bays 102 for receiving servers 104 and 106, and an adaptor assembly 110. In an embodiment, the server rack chassis 100 can be a blade server rack, the servers 104 and 106 can be blade servers, and the adaptor assembly 110 can be a blade server adaptor to enable blade servers that could not otherwise fit well within the bay 102 to connect with the server rack chassis. The adaptor assembly 110 includes an enclosure 112, a guide rail 114, a plate 116, and rails 118. The plate 116 is mounted within the middle of enclosure 112 to provide structural support to the enclosure, and the rails 118 are mounted on the inside of the walls to provide alignment and support of servers 120 within the enclosure. The adaptor assembly 110 can be designed to receive multiple servers 120. In an embodiment, the server 104 can be a full height server, the servers 106 can be half height servers, and the server 120 can be a quarter height server. With respect to this disclosure, full height indicates that the server is about the height of the bay 102, half height indicates that the server is about half of the height of the bay, and quarter height indicates that the server is about a quarter of the height of the bay. While the embodiments are discussed with respect to a blade server chassis and blade servers, the adaptor assembly 110 can be used to provide alignment for any type of device within any type of chassis.

In an embodiment, each bay 102 of the server rack chassis 100 can receive multiple servers. For example, the bay 102 can receive two servers 104, one server 104 and two servers 106, or four servers 106. Additionally, the adaptor assembly can take up substantially the same amount of space in the bay 102 as the server 104, such that the bay can receive two adaptor assemblies 110. However because each bay 102 can vary in size, the number of servers 104 and 106, and the number of adaptor assemblies 110 that can fit within a single bay can also vary.

The guide rail 114 can align with a chassis rail 122 of the server rack chassis 100 to align the adaptor assembly 110 within the bay 102. The adaptor assembly 110 can then slide into the bay 102 at a desired orientation based upon the guide rail 114 sliding along the chassis rail 122. The adaptor assembly 110 can be locked into place within the bay 102 via a locking mechanism 202, shown in FIG. 2. After the adaptor assembly 110 is locked into place within the bay 102, one or more servers 120 can be inserted into the adaptor assembly and connected to a backplane of the server rack chassis 100. The locking mechanism 202 is configured to fit within a void of the enclosure 112 between a server 120 and the server rack chassis 100.

Figure 2:
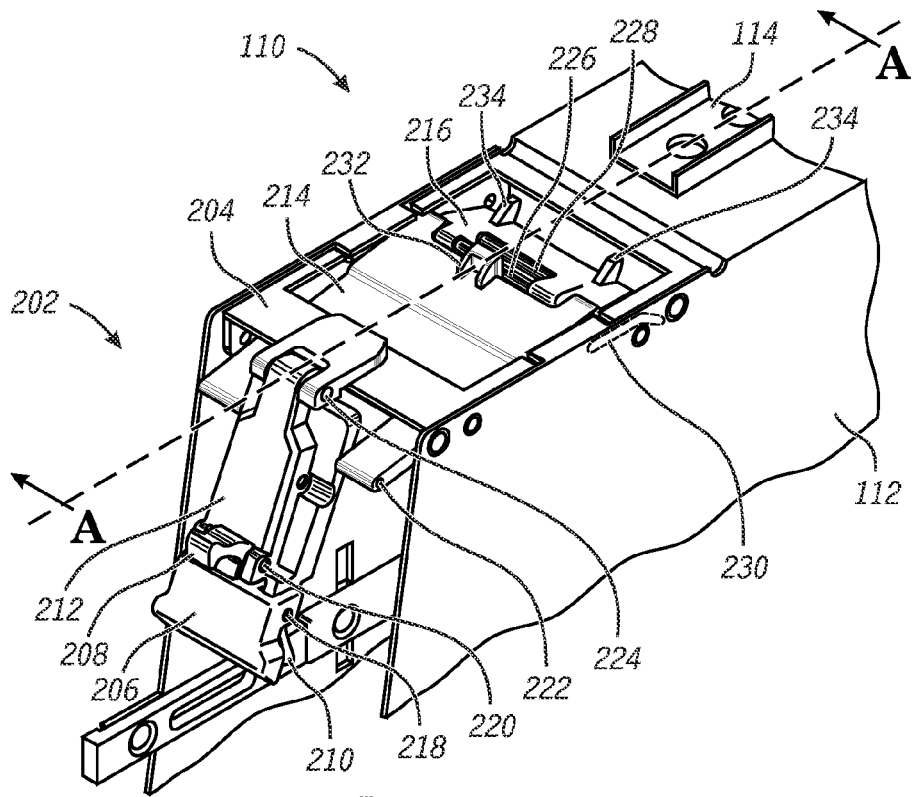
FIG. 2 is a perspective view of an adaptor assembly of the server rack chassis.

FIG. 2 shows the adaptor assembly 110 including the locking mechanism 202, the enclosure 112, and the guide rail 114. The locking mechanism 202 includes a frame 204 a handle 206, a latch 208, a release 210, an arm 212, a first link 214, a second link 216, connector pins 218, 220, 222, 224, 226, and 228, and grooves 230. The first link 214 includes a stub 232. The second link 216 includes stubs 234. The frame 204 is connected to the enclosure 112 and is located in the void in front of a top portion of the enclosure and the guide rail 114. The handle 206 and the release 210 are coupled together, and connect with the arm 212 via the connector pin 218. The latch 208 is connected to the arm 212 via the connector pin 220. The arm 212 is connected to the frame 204 via connector pin 222, and to the first link 214 via connector pin 224. The first link 214 is connected to the second link 216 via connector pin 226. Each end of the connector pin 226 extends beyond the first and second links and fits within the grooves 230 on each side of the frame 204. The connector pin 228 extends from the second link 216 and fits within the grooves 230 of the frame 204.

FIGS. 3-6 show the server rack chassis 100, the adaptor assembly 110, and the locking mechanism 202 taken along the line A-A of FIG. 2. The server rack chassis 100 includes a chassis plate 302 that includes tabs 304 and 306. The locking mechanism 202 includes a spring 308 located within arm 212. The spring 308 provides a constant force on the latch 208, such to bias the latch in a locked position. In an embodiment, the latch 208 is perpendicular to the handle 206 while in the locked position.

Figure 3:
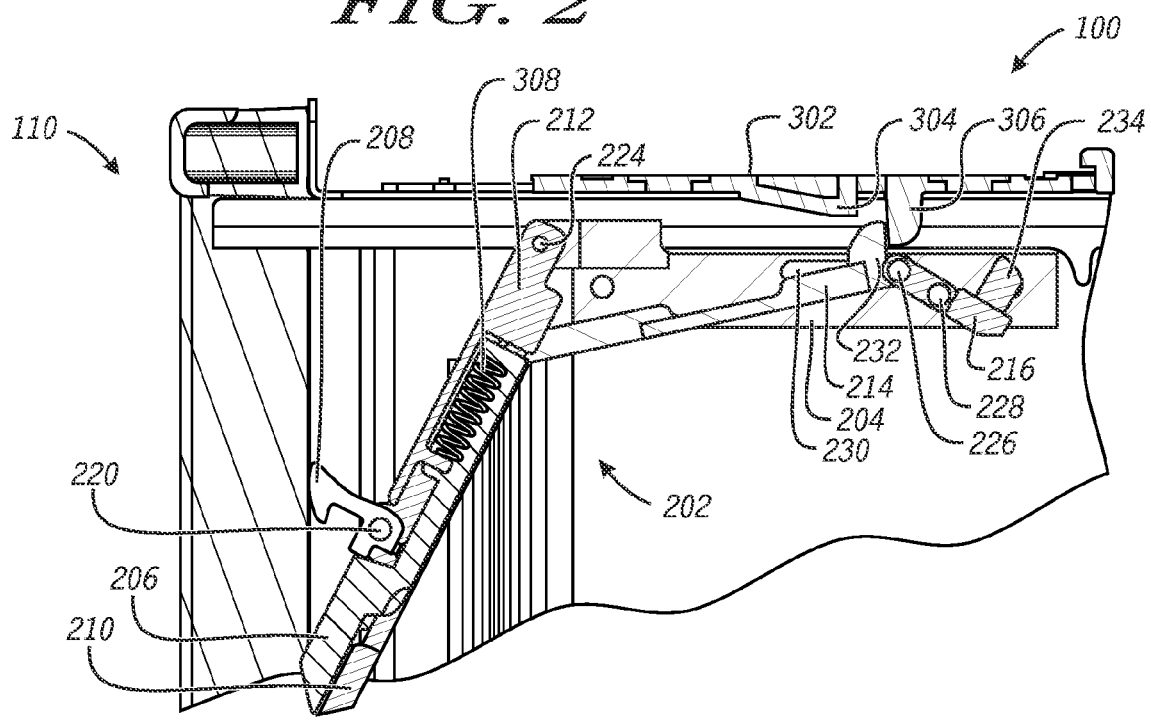
FIG. 3 is cross sectional view of the adaptor assembly including a locking mechanism in a first position.

The handle 206 and the arm 212 are preferably placed in a down position when the adaptor assembly 110 is inserted into the bay 102 of the server rack chassis 100. The handle 206 and the arm 212 can be placed in the down position by rotating the arm downwardly from the frame 204 via the connector pin 224. As the handle 206 and the arm 212 rotate downward the first and second links 214 and 216 are pushed backward in the frame 204 as a result of a force exerted by the arm on the first link via the connector pin 222. The first and second links 214 and 216 slide backwards in the frame 204 as a result of the connector pins 226 and 228 sliding in the groove 230. In an embodiment, a first portion of the groove 230 is parallel with the frame 204, and a second portion of the groove angles down and to the back of the frame as shown in FIG. 2. Thus, as the first and second links 214 and 216 slide backwards in the frame 230, the connector pin 228 slides down the angle of the groove so that the stubs 234 of the second link drop below a top edge of the frame as shown in FIG. 3. Also, as the handle 206 and the arm 212 drop to the down position, the first link 214 is angled upward and the stub 232 of the first link extends above the top edge of the frame 204.

Figure 4:
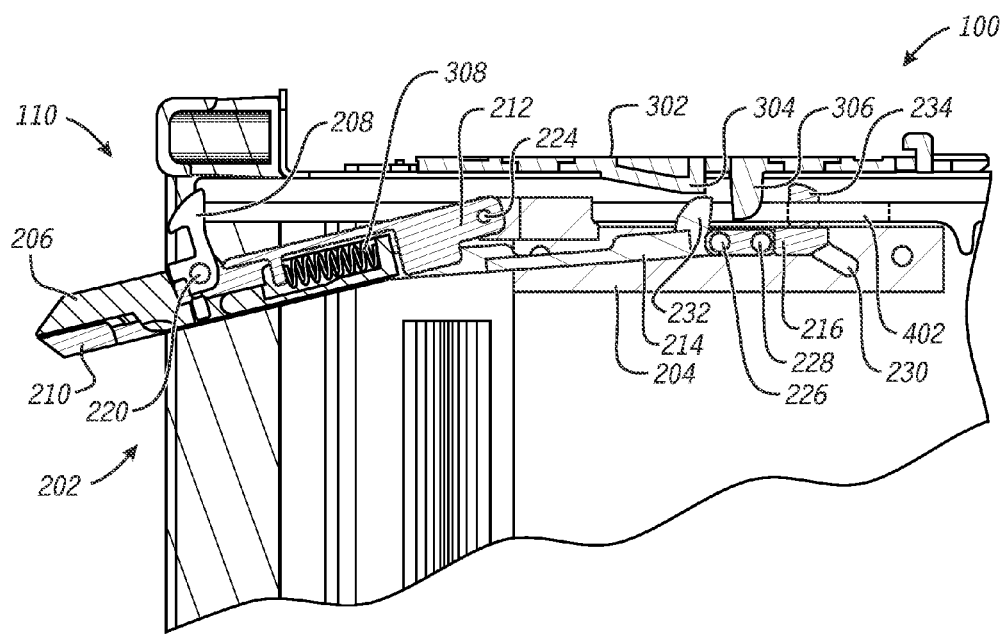
FIG. 4 is cross sectional view of the adaptor assembly including the locking mechanism in a second position.

The adaptor assembly 110 then slides into the bay 102 of the server rack chassis 100 until the stub 232 engages the stub 306 of the chassis plate 302. The contact between the stub 232 and the stub 306 indicates that the adaptor assembly 110 has been placed in a first position within the server rack chassis 100. When the adaptor assembly 110 has been placed in the first position, the handle 206 and the arm 212 can be raised upward from the down position toward a locked position. As the handle 206 and the arm 212 are raised, the arm exerts a force on the first link 214 via the connector pin 222 to pull the first link and the second link forward in the frame 204. While the handle 206 and the arm 212 are being pulled up, the connector pins 226 and 228 slide forward within the groove 230, such that both of the connector pins are located within the first portion of the groove. When the connector pins 226 and 228 are within the first portion of the groove 230, the first link 214 and the second link 216 are both substantially parallel with the chassis plate 302. As the first link 214 moves forward within the frame 204, the stub 232 moves away from the stub 306 as shown in FIG. 4.

Figure 5:
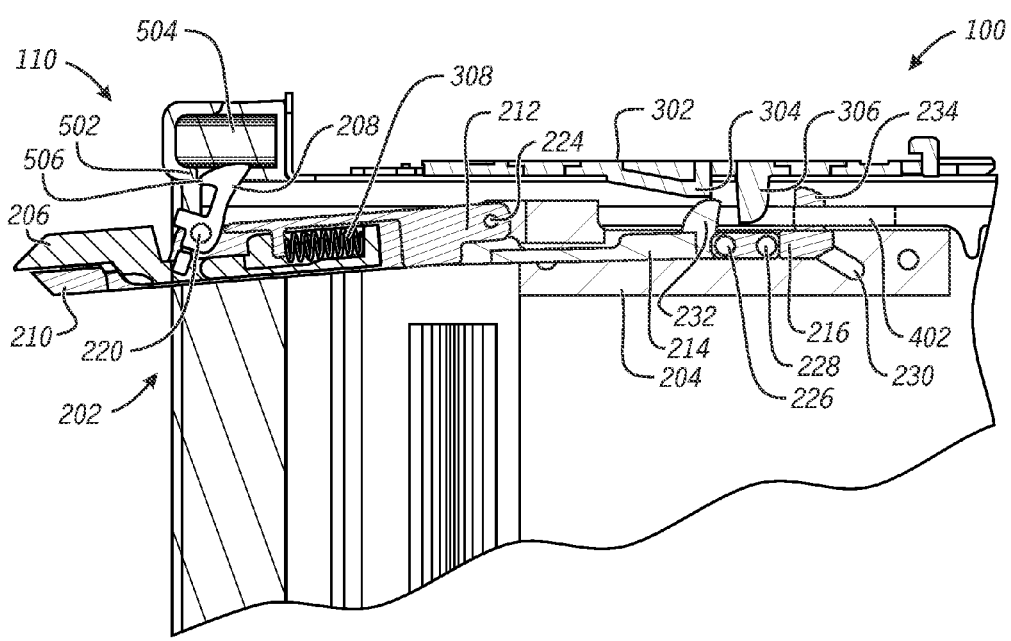
FIG. 5 is cross sectional view of the adaptor assembly including the locking mechanism in a third position.
Figure 6:
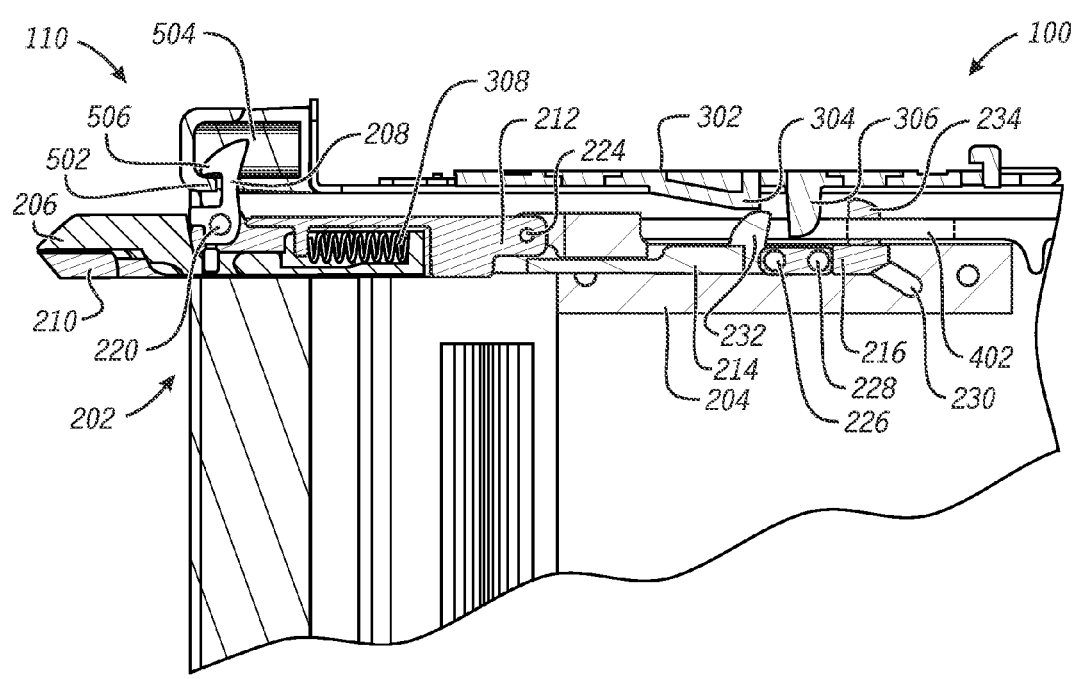
FIG. 6 is cross sectional view of the adaptor assembly including the locking mechanism in a fourth position.

The handle 206 and the arm 212 can continue to be raised up so that the latch 208 can be placed in physical communication with a hook portion 502 around a recess of the server rack chassis 100. As the handle 206 and the arm 212 continue to be raised up toward the top of the server rack chassis 100, the first link 214 and the second link 216 can continue to move forward in the frame 204. The movement of the first and second links 214 and 216 can cause the stub 234 to move up within an opening 402 of the chassis plate 302. Also, as the handle 206 is raised closer to the server rack chassis 100, a force can be applied to the latch 208 so that the latch can flex away from the hook portion 502 and a lip 506 of the latch can be placed in physical communication with the hook portion 502 of the server rack chassis 100 as shown in FIG. 5.

The flexing of the latch 208 can exert a force on the spring 308, which in turn can increase the compression on the spring. When the lip 506 of the latch 208 passes the hook portion 502 of the recess 504, the spring 308 can push back on the latch 208 and cause the latch to snap around the lip of the recess. Also, at substantially the same time as the latch 208 snaps within the recess 504, the stub 234 of the second link 216 can engage a front edge of the opening 402 of the chassis plate 302. As the stub 234 is placed in physical communication with the front edge of the opening 402, the locking mechanism 202 can pull adaptor assembly 110 further into the bay 102 of the server rack chassis 100, such that the adaptor assembly is placed in a second position. Thus, when the latch 208 is in a locked position, the lip 506 of the latch has snapped around the hook portion 502 of the recess 504, the adaptor assembly 110 is preferably fully inserted into the bay 102 of the server rack chassis.

The release 210 can be utilized to unlock the locking mechanism 202 from the server rack chassis 100. For example, the release 210 can be pressed together so that the handle 206 can be pulled forward and extended from the release and the arm 212. The extension of the handle 206 can pull a bottom portion of the latch 208, which in turn can cause the latch to flex away from the hook portion 502. Thus, when the handle 206 is fully extended the lip 506 can be clear of the hook portion 502 of the recess 504, such that the locking mechanism 202 can be pulled downwardly from the recess of the server rack chassis 100. As the handle 206 and the arm 212 are placed in the down position, the stub 234 of the second link 216 can be removed from physical communication with the front edge of the opening 402 of the chassis plate 302 while the stub 232 of the first link 214 can be placed in physical communication with the stub 306 of the chassis plate. The stub 232 can exert a force against the stub 306 so as to push the adaptor assembly 110 into the first position within the bay 102 as shown in FIG. 3. After the adaptor assembly 110 is placed in the first position, the adaptor assembly can then be completely removed from the server rack chassis 100.

Figure 7:
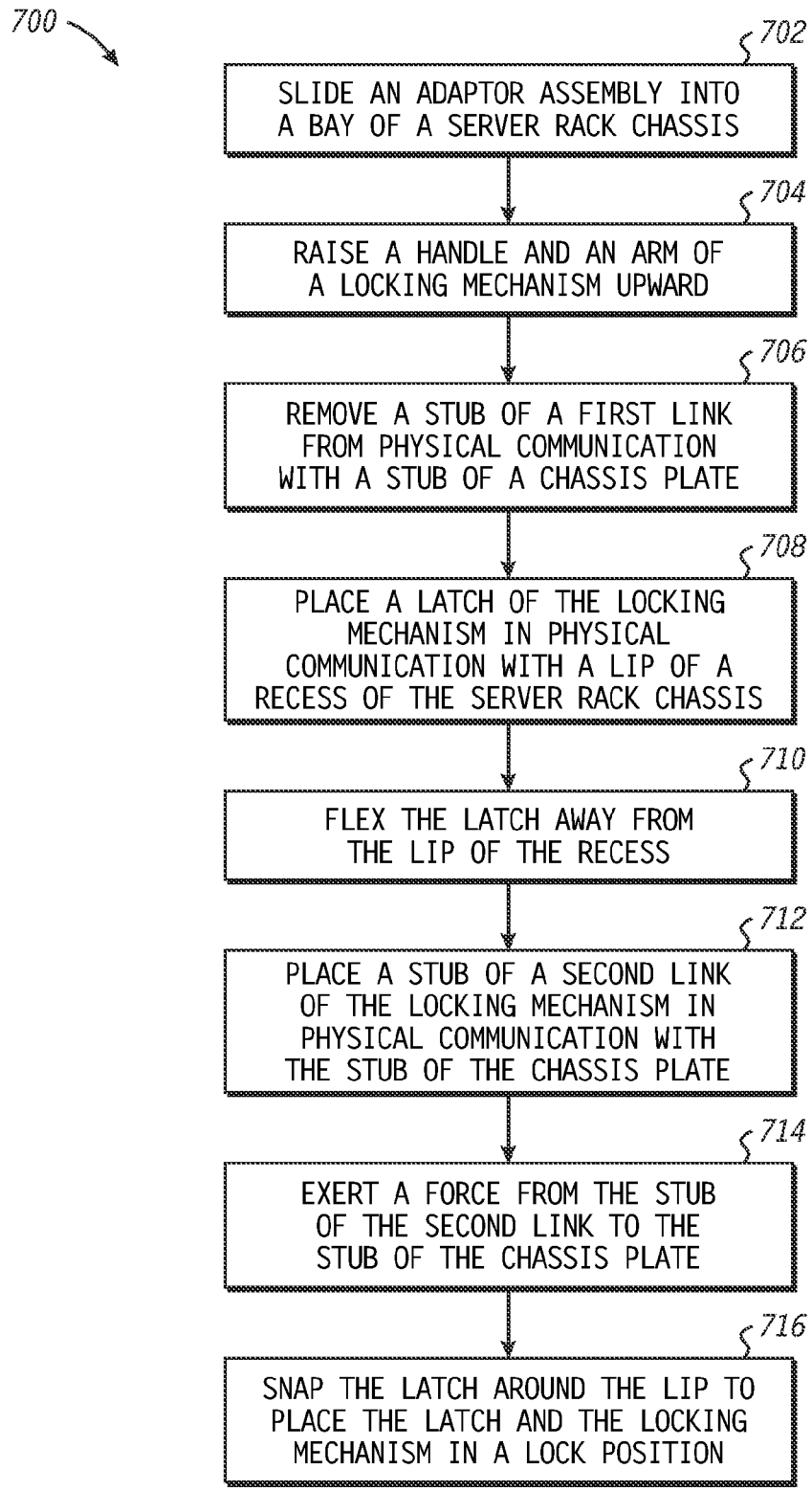
FIG. 7 is a flow diagram of a method for inserting the adaptor assembly within a bay of the server rack chassis.

FIG. 7 shows a flow diagram of a method 700 for inserting an adaptor assembly within a bay of a server rack chassis. At block 702, the adaptor assembly is slid into the bay until the adaptor assembly is placed in a first position within the server rack chassis. A guide rail of the adaptor assembly can slide along a chassis rail while the adaptor assembly is inserted into the bay to ensure that the adaptor assembly is properly aligned in the bay. The first position of the adaptor assembly within the server rack chassis can be when a stub of a first link of a locking mechanism is placed in physical communication with a stub of a chassis plate in the server rack chassis. A handle and an arm of the locking mechanism are raised upward at block 704.

At block 706, the stub of the first link is removed from the physical communication with the stub of the chassis plate. A latch of the locking mechanism is placed in physical communication with a lip of a recess in the server rack chassis at block 708. At block 710, the latch is flexed away from the lip of the recess as the handle and the arm are continued to be raised upward. A stub of a second link of the locking mechanism is placed in physical communication with the stub of the chassis plate at block 712. At block 714, the stub of the second link exerts a force against the stub of the chassis plate, which causes the adaptor assembly to be placed at a second position within the server rack chassis. The latch snaps around the lip of the recess, such that the locking mechanism and the latch are placed in a locked position at block 716.

Figure 8:
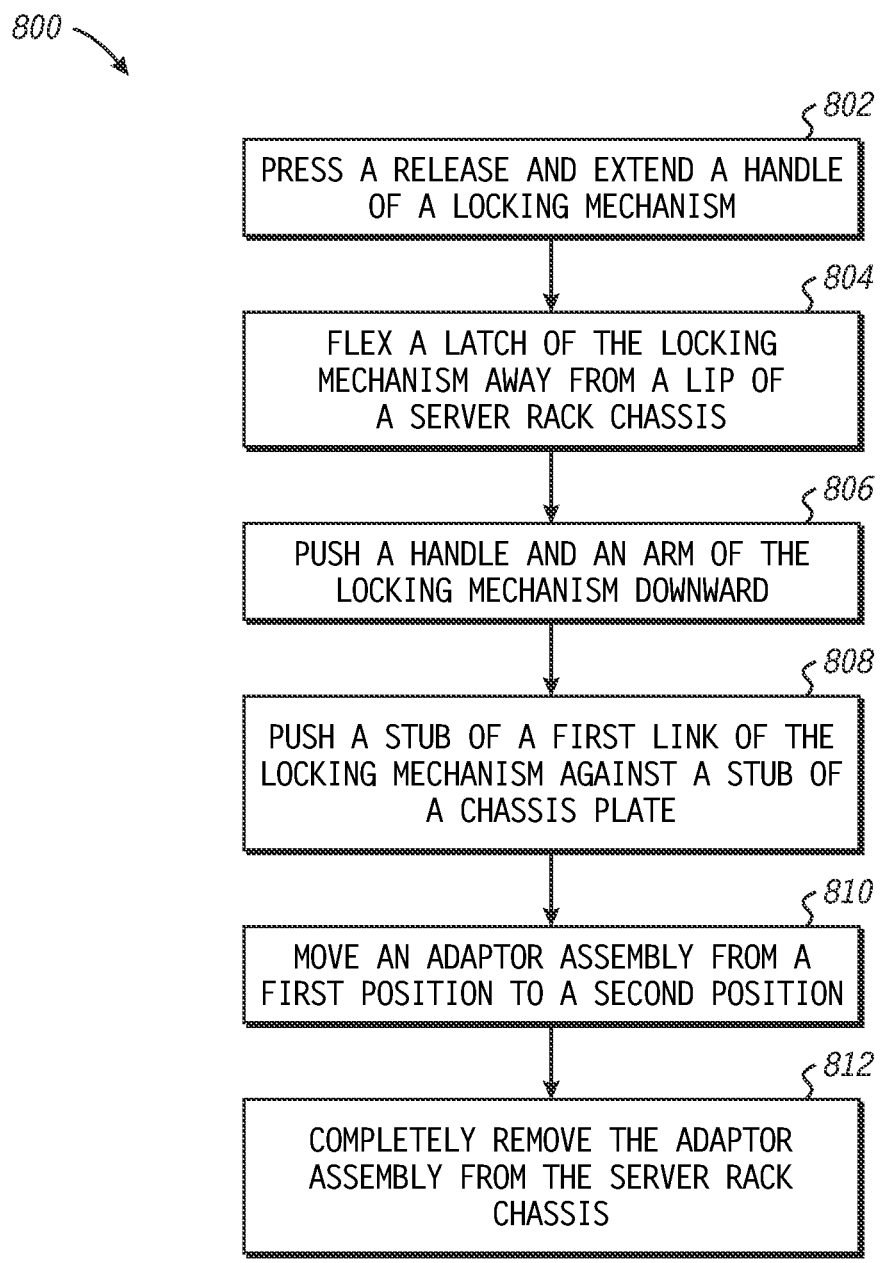
FIG. 8 is a flow diagram of a method for releasing the locking mechanism of the adaptor assembly.

FIG. 8 shows a flow diagram of a method 800 for releasing a locking mechanism of an adaptor assembly. At block 802, a release is pressed and a handle is extended from the locking mechanism. A latch of the locking mechanism is flexed away from a lip of a server rack chassis in response to the handle being extended at block 804. At block 806, a handle and an arm of the locking mechanism can be pushed downward. A stub of a first link of the locking mechanism is pushed against a stub of a chassis plate in response to the handle and the arm of the locking mechanism being placed in a down position at block 808.

At block 810, the adaptor assembly is moved from a first position to a second position within the bay of the server rack chassis in response to the stub of the first link being pushed against the stub of the chassis plate. In an embodiment, the adaptor assembly is in the first position when the adaptor assembly is all the way inside the server rack chassis and the second position is locking enable position for the adaptor assembly such that the adaptor has not been completely inserted within the server rack chassis. At block 812, the adaptor assembly is completely removed from the bay of the server rack chassis.

Although only a few exemplary embodiments have been described in detail in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. A locking mechanism comprising:
   a latch to engage with a recess of a server rack chassis, and to lock an adaptor assembly within the server rack chassis;
   a handle connected to the latch, the handle to engage and disengage the latch with the recess;
   a first link including a first stub, the first link to put the first stub in an up position in response to the handle being in a down position, and to put the first stub in a down position in response to the handle being in an up position;
   a second link including a second stub, the second link to put the second stub in a down position in response to the handle being in the down position, and to put the second stub in an up position in response to the handle being in the up position;
   a spring connected to the latch, the spring to bias the latch in a locked position;
   wherein the first stub is placed in physical communication with a third stub of a chassis plate in the server rack chassis when the adaptor assembly is in a first position within the server rack chassis, the second stub engages the third stub of the chassis plate in the server rack chassis when the latch snaps within the recess, wherein the second stub pulls the adaptor assembly further into the server rack chassis and places the adaptor assembly in a second location when the latch is placed in the locked position.

2. The locking mechanism of claim 1 wherein the latch deflects away from the recess until a hook portion of the latch is beyond a lip of the recess and snaps back to the locked position when the hook portion is beyond the lip.

3. The locking mechanism of claim 1 wherein the first stub is pushed against the third stub of the server rack chassis to reject an adaptor assembly from the server rack chassis when the handle is in a down position.

4. The locking mechanism of claim 1 further comprising:
   a frame to connect the first link to an arm that is connected to the handle, and to connect the first link with the second link, wherein the frame controls the first link and the second link to rotate in opposite directions.

5. The locking mechanism of claim 1 further comprising:
   a release connected to the handle and to the latch, the release to cause the latch to move to an unlock position in response to the release being in an extended position.

6. An adaptor assembly comprising:
   an enclosure configured to be placed within a server rack chassis and to receive a quarter height server; and
   a locking mechanism in physical communication with the enclosure, the locking mechanism including:
   a latch to engage with a recess of a server rack chassis, and to lock the adaptor assembly within the server rack chassis;
   a handle connected to the latch, the handle to engage and disengage the latch into a locked position within the recess;
   a first link including a first stub, the first link to put the first stub in an up position in response to the handle being in a down position, and to put the first stub in a down position in response to the handle being in an up position; and
   a second link including a second stub, the second link to put the second stub in a down position in response to the handle being in the down position, and to put the second stub in an up position in response to the handle being in the up position;
   wherein the first stub is placed in physical communication with a third stub of a chassis plate in the server rack chassis when the adaptor assembly is in a first position within the server rack chassis, the second stub engages the third stub of the chassis plate in the server rack chassis when the latch snaps within the recess, wherein the second stub pulls the adaptor assembly further into the server rack chassis and places the adaptor assembly in a second location when the latch is placed in the locked position.

7. The adaptor assembly of claim 6 wherein the latch deflects away from the recess until a hook portion of the latch is beyond a lip of the recess and snaps back to the locked position when the hook portion is beyond the lip.

8. The adaptor assembly of claim 6 wherein the first stub is pushed against the third stub of the server rack chassis to reject an adaptor assembly from the server rack chassis when the handle is in a down position.

9. The adaptor assembly of claim 6 wherein the locking mechanism further comprises:
 a release connected to the handle and to the latch, the release to cause the latch to move to an unlock position in response to the release being in an extended position.

10. A server rack chassis comprising:
 a bay configured to receive a full height server;
 an enclosure inserted within the bay, the enclosure to receive a quarter height server; and
 a locking mechanism in physical communication with the enclosure, the locking mechanism including:
 a latch to engage with a recess of the server rack chassis, and to lock an adaptor assembly within the server rack chassis;
 a handle connected to the latch, the handle to engage and disengage the latch with the recess;
 a first link including a first stub, the first link to put the first stub in an up position in response to the handle being in a down position, and to put the first stub in a down position in response to the handle being in an up position; and
 a second link including a second stub, the second link to put the second stub in a down position in response to the handle being in the down position, and to put the second stub in an up position in response to the handle being in the up position;
 wherein the first stub is placed in physical communication with a third stub of a chassis plate in the server rack chassis when the adaptor assembly is in a first position within the server rack chassis, the second stub engages the third stub of the chassis plate in the server rack chassis when the latch snaps within the recess, wherein the second stub pulls the adaptor assembly further into the server rack chassis and places the adaptor assembly in a second location when the latch is placed in the locked position.

11. The server rack of claim 10 wherein the latch deflects away from the recess until a hook portion of the latch is beyond a lip of the recess and snaps back to the locked position when the hook portion is beyond the lip.

12. The server rack of claim 10 wherein the first stub is pushed against the third stub of the server rack chassis to reject an adaptor assembly from the server rack chassis when the handle is in a down position.

13. The server rack of claim 10 further comprising:
 a frame to connect the first link to an arm that is connected to the handle, and to connect the first link with the second link, wherein the frame controls the first link and the second link to rotate in opposite directions.

\* \* \* \* \*